United States Patent [19]
Fisher et al.

[11] Patent Number: 5,345,413
[45] Date of Patent: Sep. 6, 1994

[54] DEFAULT FUSE CONDITION FOR MEMORY DEVICE AFTER FINAL TEST

[75] Inventors: Richard J. Fisher, Phoenix; Samuel E. Alexander, Gilbert, both of Ariz.

[73] Assignee: Microchip Technology Incorporated, Chandler, Ariz.

[21] Appl. No.: 41,069

[22] Filed: Apr. 1, 1993

[51] Int. Cl.$^5$ .............................................. G11C 17/00
[52] U.S. Cl. ..................... 365/96; 365/201; 365/230.03
[58] Field of Search .............. 365/96, 225.7, 230.03, 365/201, 218, 195

[56] References Cited

U.S. PATENT DOCUMENTS

| | | | |
|---|---|---|---|
| 4,887,239 | 12/1989 | Turner | 365/218 |
| 5,084,843 | 1/1992 | Mitsuishi | 365/218 |

*Primary Examiner*—Eugene R. LaRoche
*Assistant Examiner*—A. Zarabian
*Attorney, Agent, or Firm*—O'Connor, Cavanagh

[57] ABSTRACT

The usability of an electrically erasable programmable semiconductor memory device is assured after shipment from the factory despite implementing the device with a user option to selectively configure the security, endurance, organization, density or protocol of the memory array of the device. The user selected configuration is made permanent and inaccessible for change by programming associated normally reversible configuration fuses which are rendered incapable of being reprogrammed (reversed) thereafter by the automatic and simultaneous programming of a lockout fuse. Final testing of the device at the factory is permitted by an override of the lockout fuse during testing of the operation of the configuration fuses, and, when the testing is completed, returning, under program control, all fuses to a default condition in which the configuration fuses are limited to one-time programmability as a consequence of automatic simultaneous programming of the lockout fuse and configuration fuses at any time after shipment of the device from the factory.

7 Claims, 4 Drawing Sheets

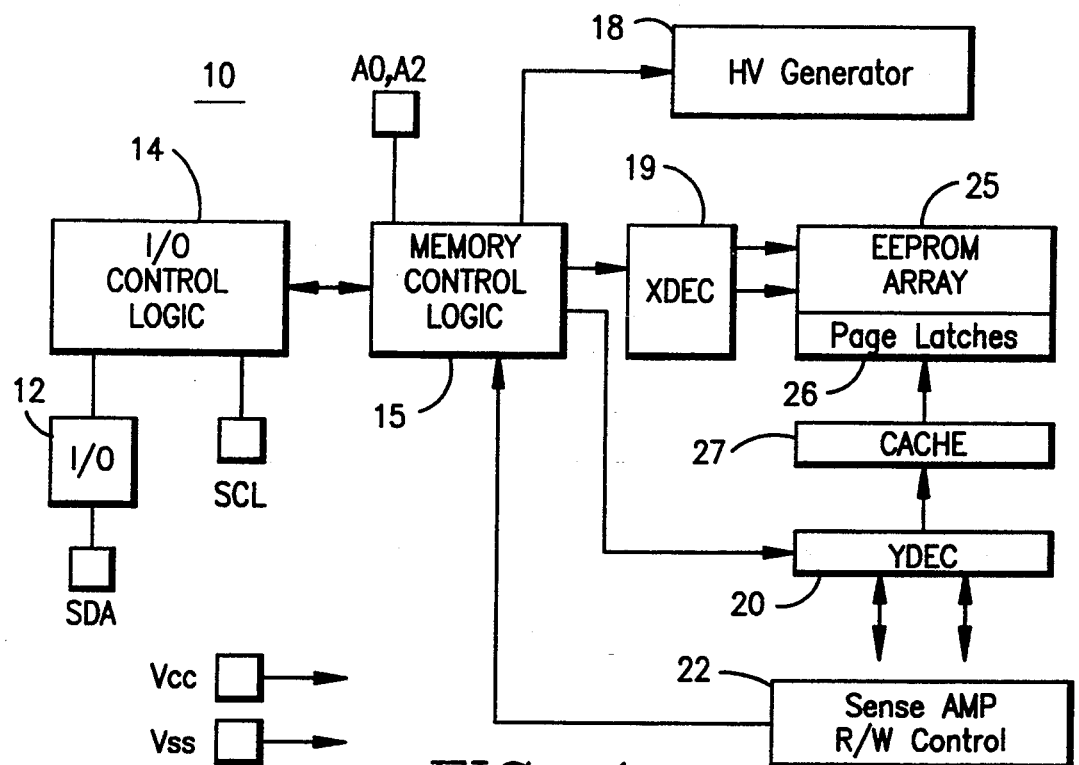
FIG. 1
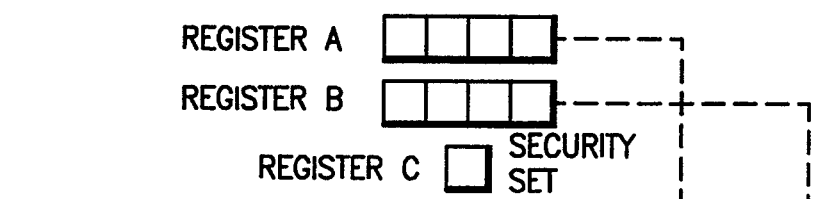
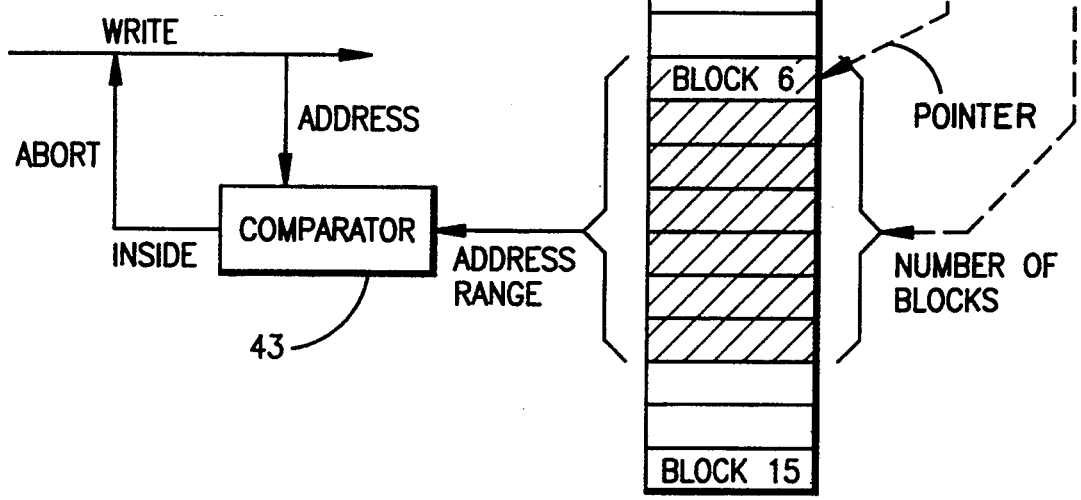
FIG. 2

FIG. 4A Control Sequence Bit Assignments

| Control Byte | | | | | Address Byte 1 | | Address Byte 0 | Security Byte | | | | |
|---|---|---|---|---|---|---|---|---|---|---|---|---|
| SLAVE ADDRESS | DEVICE SELECT | R/W | S | X | X | A12–A8 | A7–A0 | E/W | R | X | X | Blk Cnt |
| 7 | | | | | 0 | 7 | 4 0 7 0 | 7 | 6 | 5 | 4 | 3 0 |

FIG. 4B Security Write (Block one)

| ADDRESS | DEVICE SELECT | R/W | S | X | X | A12–A8 | A7–A0 | E/W | R | X | X | Blk Cnt |
|---|---|---|---|---|---|---|---|---|---|---|---|---|
| 1010 | 000 | 0 | 1 | X | X | 0000X | XXXXXXXX | 1 | 0 | X | X | 0001 |

0000X → Block Select Bits

FIG. 4C Endurance Block Write (Block zero)

| ADDRESS | DEVICE SELECT | R/W | S | X | X | A12–A8 | A7–A0 | E/W | R | X | X | Blk Cnt |
|---|---|---|---|---|---|---|---|---|---|---|---|---|
| 1010 | 000 | 0 | 1 | X | X | 0000X | XXXXXXXX | 0 | 0 | X | X | 0101 |

0000X → Block Select Bits

DEFAULT FUSE CONDITION FOR MEMORY DEVICE AFTER FINAL TEST

BACKGROUND OF THE INVENTION

The present invention relates generally to semiconductor integrated circuit (IC) memory chips or devices, and more particularly to erasable programmable memory devices such as electrically erasable (alterable) programmable read only memories (EEPROMs) which are adapted to prevent a secure programmed condition from being violated by reprogramming or other means.

Erasable programmable memory devices such as EEPROMs may be provided with various configurable options that allow the user to selectively configure the device according to the user or its customers' needs. For example, the internal memory of the device may be composed of contiguous blocks or banks, and the user may desire to maintain security for some or all of the memory blocks. One type of security would be to "write protect" certain ones of the blocks to prevent the data stored in those blocks from being erased and written over. A scheme for doing so is described in detail in copending U.S. patent application Ser. No. 08/041,068, filed on the same date and assigned to the same assignee as this application, and incorporated herein by reference. According to the invention described in that application, configurable fuses are selectively "blown" (i.e., programmed) to prevent access to the write protected portion of the memory after desired "permanent" data has been written to that portion.

Although reference is made here to the "blowing" of fuses, it will be understood that the fuses typically would not be metal strips, but programmable components such as EEPROM cells having erased/written states that correspond to an unblown/blown fuse, or other fusible means adapted to be reparable (i.e., reversed from, for example, a "blown" or set state to a cleared state).

Another type of configurable option for the memory device might be a programmable endurance scheme for imbuing selective high endurance characteristics to any portion of the otherwise relatively low endurance memory. A programmable high endurance block technique is described in detail in copending U.S. patent application Ser. No. 08/041,642, filed on the same date and assigned to the same assignee as this application, and incorporated herein by reference.

According to the invention described in that application, a selectable redundant block of memory of smaller capacity than the maximum memory capacity of the data memory of an EEPROM array is provided to give the array a programmable high endurance capability. The redundant block is placed in parallel with a selected (programmed) regular block of the data memory of the same capacity. Thus, both of those blocks are written to, read, erased or rewritten to together, so that they hold (and have removed from them) the same data as these functions are performed. The selected block thereby effectively becomes a high endurance block, because of the very remote probability that identical memory cells in the two blocks will fail within a number of erase/write cycles that constitute high endurance.

A high endurance register/pointer defines the block of memory to be rendered high endurance, while two security register/pointers are used to set the write protection of other memory blocks. The latter two pointers define the starting block and the number of blocks of memory to be rendered secure, respectively. It is axiomatic that the high endurance block will not be write protected because the intention is to write to and erase that block many times over, perhaps tens of thousands of times during the lifetime of the device. An example of this is the "last number redial" function for a telephone.

After the pointers associated with these configurable options have been set (programmed), one or more configuration fuses (e.g., a set of fuses) associated with each register are "blown", effectively opening the respective circuit path. Additionally, a separate lockout fuse is automatically "blown" after (or at the time) all of the configuration fuses have been set, thereby eliminating any further capability of programming them so that they cannot be altered thereafter. This provides security against reversing the state of one or more of the configuration fuses to allow access to change the configurable options or to alter the otherwise secure contents of the memory.

A problem arises in that if the configuration fuses are inadvertently programmed at the factory to states that lock the EEPROM device in a non-standard configuration, such as with one or more data memory blocks in a write protected condition, the device is rendered unusable to the customer. That is, if a substantial portion of the EEPROM memory contains blank data which has been write protected at the factory when the device is received by the original equipment manufacturer (OEM), the device is not usable as an EEPROM, but only as a ROM. Another example of the EEPROM being locked in a non-standard configuration is where the organization of the memory may be either X8 or X16 and the fuse by which the OEM-specified organization is determined has been improperly set at the factory.

The problem is compounded in that the operation of the fuses cannot be tested at the device manufacturer's factory by writing to them, because doing so also writes to ("blows") the lockout fuse, which then prevents the configuration fuses from being erased or otherwise verified as to their present state at the factory before shipment to the customer.

Accordingly, it is a principal object of the present invention to provide apparatus and methods for assuring, prior to shipment from the factory, that programmable configuration fuses of a semiconductor device having one or more configurable options are programmed to states that will allow the device to be used as desired by the customer.

Another important object of the invention is to permit an EEPROM device having fusible configurations that, once set, will be locked by the state of another fuse against subsequent change, to be subjected to testing of the fuses and the various configurations at the factory and yet assure that the device as shipped to the customer is not rendered unusable by an inadvertent locked status of the configuration fuses.

Another broader object is to provide improvements in testing EEPROMs.

SUMMARY OF THE INVENTION

An example of a semiconductor device to which the invention may be applied is a 64K-bit CMOS serial EEPROM that employs programmable, or fuse configurable, options such as a security scheme for selective write protection of any portion of the on-chip data memory and a programmable endurance scheme for imbuing selective high endurance characteristics to any portion of the otherwise relatively low endurance data memory. The exemplary EEPROM device has three registers for storing address or related information to control or implement associated pointers which identify the write protected or high endurance portions.

According to the invention, the possibility that the device will be shipped from the factory in a locked non-standard device configuration that renders it unusable to the customer is avoided by a special final test procedure at the factory that overrides the lockout fuse for final testing of the fuses, and then places all fuses including the lockout fuse in a default condition or state that renders them one-time programmable thereafter. This assures that the received device is usable, that its configuration fuses can be programmed by the OEM to configure the various available options of the device according to the OEM's desires, and yet preclude further alteration of the fuses for changes in configuration or access to secure portions by subsequent users.

It should be noted that the intention of this "return to default condition" is to give the initial customer (e.g., the OEM) the capability to perform one-time field programming of the device (such as for high endurance and write protection), which would be the typical case. If, however, the device is to be used in a QTP (quick turn programming) type of application, where the customer requests that the desired final programming be performed at the factory, the device would not be returned to the default condition at the time of shipment but would instead be left in the fully programmed state to eliminate any further alteration of the fuses.

In practice, clearing (or override) of the lockout fuse of the device would be allowed only through a special configuration known to the device manufacturer, so that neither the customer nor anyone else could normally clear the lockout fuse. This assures that the configuration options selected by the customer, and all security provided by the option selections (such as write protection of a portion of the memory) will be maintained permanently. The factory special test mode dictates that all configuration fuses will be written at the same time, and that after the testing is performed all of them, including the lockout fuse, are cleared to return them to the default configuration.

Therefore, another, more specific object of the invention is to provide improvements in techniques for implementing configurable options in serial EEPROMs which allow selection of security, endurance, organization, density, protocol and other features and functions by means of programming normally reversible (reparable) fuses (individual EEPROM cells, or one bit registers) using a lockout fuse which effectively renders them one-time programmable (irreversible, or irreparable), and which allow factory testing of the fuses and associated selected functions by temporarily overriding the lockout fuse only until testing is completed, and then returning all fuses to a default condition.

BRIEF DESCRIPTION OF THE DRAWINGS

The above and other objects, features and attendant advantages of the invention will become clear from the following detailed description of the best mode presently contemplated for practicing the invention, with reference to the accompanying drawings in which:

FIG. 1 is a block diagram of a serial EEPROM device in which the preferred embodiment or method of the invention may be implemented or practiced;

FIG. 2 is a simplified block diagram illustrating selection of blocks of the data memory desired by the user to be secured by write protection;

FIGS. 4A, 4B and 4C are diagrams of the control sequence bit assignments, the security write for write protected block selection, and the endurance block write for high endurance block selection, respectively;

DETAILED DESCRIPTION OF THE PREFERRED EMBODIMENT AND METHOD

Figure 3:
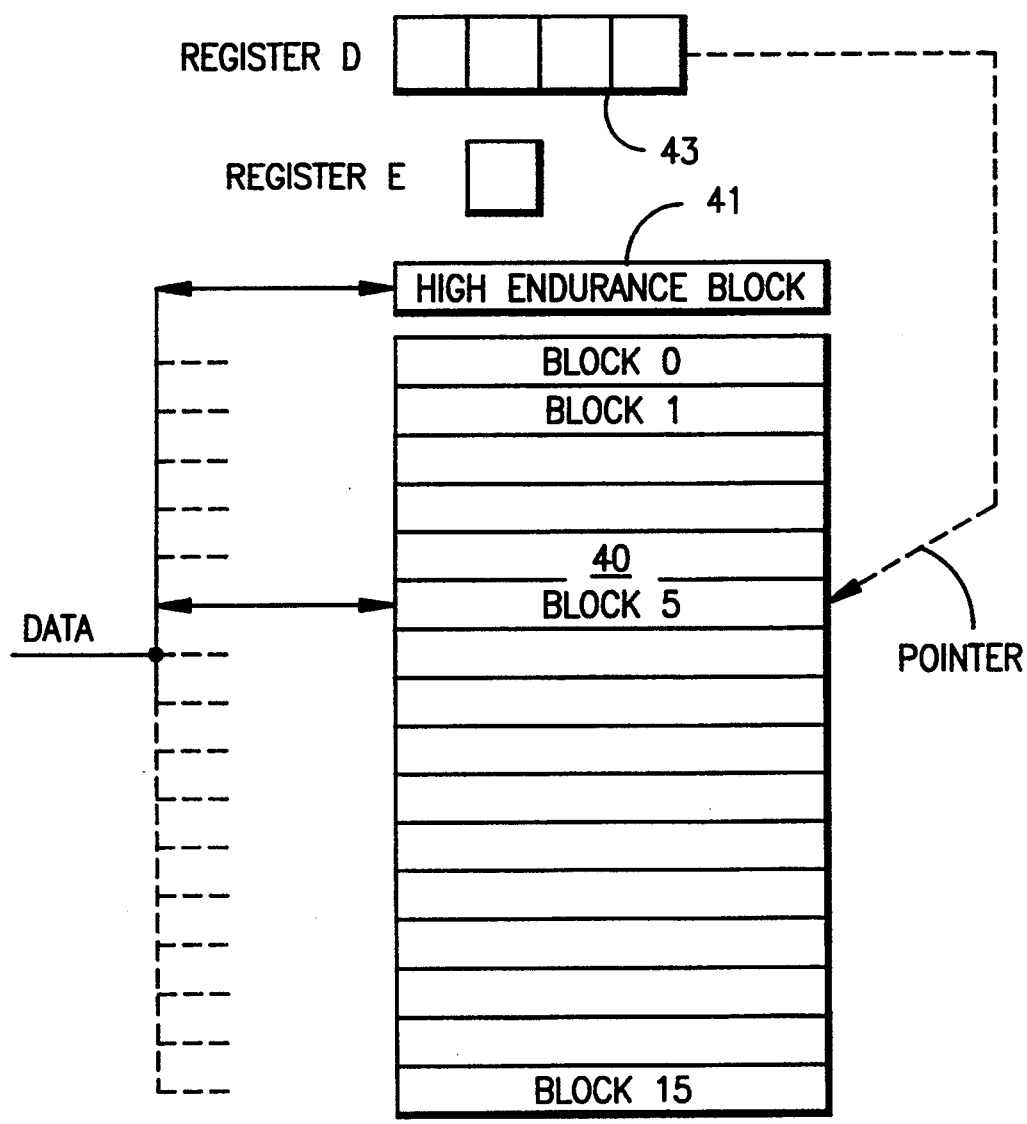
FIG. 3 is a simplified block diagram illustrating selection of a high endurance block in the data memory of the device of FIG. 1.

For the sake of illustration and not limitation, the invention is implemented in the environment of a 64K (8K×8) low voltage serial EEPROM 10 (FIG. 1) especially suited for low power applications, such as are found in the personal communications and (e.g., cellular phone) and other markets.

EEPROM 10 includes pins A0, ..., An, which in this example are A0, A1 and A2 user configurable chip selects, and pins SDA (serial address/dam input/output (I/O)) and SCL (serial clock). The A0, A1 and A2 chip address inputs are used by the EEPROM for multiple device operation and conform to the I$^2$C bus standard. The level on these pins defines the address block or bank occupied by the device in an address map. This address may then be compared to the corresponding bits in a slave address for selecting the appropriate device from among the multiple devices.

The SDA pin is bidirectional and used to transfer addresses and dam into the device, and dam out of the device. The pin is an open drain terminal. For normal dam transfer, the SDA is allowed to change only during SCL low. Changes during SCL high are reserved for indicating start and stop conditions (described below). The SCL serial clock input is used to synchronize the data transfer from and to the device.

Pins $V_{SS}$ and $V_{CC}$ are for electrical ground and power supply (e.g., +1.8 V to 5.5 V), respectively.

The overall EEPROM device 10 has an I/O interface 12 and I/O control logic 14 that communicates with memory control logic 15. Control logic 15 supplies inputs to HV (high voltage) generator 18, XDEC (X-line decoder) 19, YDEC (Y-line decoder) 20, and also communicates with sense AMP (amplifier) R/W (read/write) control 22. The XDEC controls EEPROM array 25 with page latches 26 that are controlled by cache 27 and in turn by YDEC 20. The latter also communicates with sense AMP R/W control 22.

Device 10 would typically be fabricated using CMOS process technology to render it more suitable for low power nonvolatile code and data applications. The device is conveniently packaged in an 8 pin (A0, A1, A2, $V_{SS}$, $V_{CC}$, NU (not used) pin, SCL and SDA) DIP (dual in-line package) or SOIC (small outline integrated circuit) package.

As will be more fully described below, the device is strategically provided with programmable fuses in the form of one cell EEPROMs modelled as one bit registers, which may be written to and erased at will to act as set (blown) fuses and cleared (repaired) fuses, respectively. Normally such EEPROM cell fuses are fully reversible. They are used in device 10 to enable selection of configurable options, and are therefore sometimes referred to in this specification as configuration fuses.

Referring now to FIG. 2, assume, for example, that it is desired to program the EEPROM device to render one or more contiguous blocks of its data memory 40 secure. The scheme used is that described in the aforementioned '068 application, which is summarized here for the sake of convenience. In the embodiment of FIG. 2, the 64K memory 40 is divided into sixteen blocks of 4K bits each. If blocks 6 through 12 inclusive are to be designated for write protection, the address of the first block of those to be secured (the "security start" block), here block 6, is stored in a shift register A. That register provides a pointer to the designated security start block.

The total number of contiguous blocks of memory to be secured (here, seven), commencing with the security start block, is then entered into a second shift register B. This number must always be non-zero and should range from one block to fifteen blocks, depending on the number of blocks to be write protected. Of course, if all sixteen blocks of data memory were intended to be write protected so that their contents could not be altered, a less expensive factory programmed ROM or a PROM would be selected for use, rather than an EEPROM. Each of registers A and B is a four-bit register capable of storing the binary address of the security start block and the number of blocks to be write protected, respectively.

Once the write protected blocks are identified by the information stored in the registers, the destination for each write operation is examined. Specifically, a compare step is performed by comparator 43 in which the address of the memory block where the erase or write is to be done is compared in sequence with the addresses of the memory blocks in the write protected area. If the address for the attempted write is the same as any address in the write protected area, the comparator generates an abort signal and the write operation is aborted before delivery of the data to be written to the protected block.

According to an aspect of the present invention, once register B has been programmed with the number of contiguous blocks to be write protected commencing with the security start block designated in register A, the two registers are rendered inaccessible to prevent those block addresses from being altered thereafter. To that end, one or more configuration fuses, such as one bit register C, are blown to "open" the circuit paths to the two registers. The OEM can thus select that portion of the device memory which is to be made substantially permanent in the sense that it cannot be altered by subsequent users. The security is a one time only instruction which, if tested at the factory, needs to be reversed to a cleared (default) state before the device is delivered to the customer.

In use at the user's site, data may be written into the memory blocks, including those which are to be ultimately designated for write protection. Access for alteration of the identity of the non-erasable memory blocks is prevented by selectively blowing the appropriate fuse(s) coupling the registers to a programming path of the device. At that point, data cannot readily be erased from the secure memory blocks, while the memory blocks which have not been designated as write protected may be electrically erased and rewritten at will.

Another potentially configurable option for selection by the OEM is device endurance. Typically, the memory blocks in the 64K EEPROM's data memory have an endurance (i.e., the number of times a cell can be erased and rewritten without corrupting data) of about 10,000 erase/write (E/W) cycles. It may be desirable, however, to have available a high endurance block of the memory to be used for a function that is frequently rewritten, perhaps many times each day, such as the last number redial function of a personal communications application, with as many as one million or more E/W cycles.

Referring to FIG. 3, it is desired to provide block 5 of data memory 40 with the desired high endurance characteristics. The scheme used is that described in the aforementioned '642 application, which is also summarized here for the sake of convenience. In the embodiment of FIG. 3, a separate redundant block 41 of memory, of the same or substantially the same endurance characteristic as each of the blocks of memory 40, is implemented off- or, preferably, on-chip. Block 41 has the same bit storage capacity or size as that of block 5 and of each of the other blocks of the memory array. The redundant block 41 is programmed to be placed in parallel with the desired high endurance block 5 so that the two blocks will be subjected to simultaneous writing, reading, and erasure of their identical cells.

The parallel coupling is accomplished by writing the desired block number (the address of block number 5, in this example) to a register D. A pointer associated with register D causes any data written to memory block 5 to be written as well to redundant block 41. The same parallel operation occurs for erasure or reading of data from block 5. Since identical data is erased or written simultaneously to the two blocks, the endurance of each of them is considerably enhanced simply because the probability that identical memory cells in both blocks will undergo failure (loss of endurance) is remote compared to the probability that any given cell in a single block will fail.

According to a further aspect of the present invention, after the desired identity of the high endurance block within data memory 40 has been programmed, a fuse modeled as a one-bit register is written (i.e., set) to preclude access to register D and thus prevent alteration of the address of the designated high endurance block. This is done just as it was in the case of the write protection security example described above. Indeed, in the preferred embodiment, register C of FIG. 2 is used to accomplish the permanence of the high endurance block, the rationale being that once the security is set the high endurance block cannot be relocated because it might breach security. Alternatively, a separate one bit register E may be provided as shown in FIG. 3, to make the pointer one time writable.

FIG. 4A illustrates control sequence bit assignments for selection of various options in EEPROM 10. The control byte includes slave address, device select and read or write (R/W) selection. This is followed by two eight-bit (0–7) address bytes, and an eight-bit security byte. One option is the write protected block security scheme.

The most significant bit in the first address byte of the write sequence enables the scheme. When that bit is set to a one, the next byte (the security byte in FIG. 4A) defines the security. The security byte includes an erase/write (E/W) flag, a pointer to the starting 4K block to be write protected, and a four bit code for determining the number of 4K blocks to be protected.

During a normal write sequence, if an attempt is made to write to or across a protected block, the device ignores the write sequence to this block. Any data written to unprotected blocks will be written, even though a security boundary may be crossed. The programmed high endurance memory block 5 is intentionally left unprotected because the mere fact of setting a particular block to the high endurance characteristic means that it is to be written to repeatedly, i.e., there is no need to protect it.

FIG. 4B shows an example of providing security by write protecting block 6 as the security start block of data memory 40. With bit 7 of the security byte set high, bit 6 set low, and the lower four bits defining the number of blocks to secure, block 6 is designated by the block select bits in address byte 1.

FIG. 4C shows an example of designating data memory block 5 as the high endurance block. Bit 7 is set high (1) and the appropriate other bits of the byte are set low (0) to execute the "set high endurance block" command. The address loaded in this command is actually the address of the first memory location in the 4K block of regular memory which is to be set to high endurance by the paralleling with redundant block 41, as described above. Only one block of the data memory can be designated for high endurance because only one redundant block is available to be paralleled with the selected block.

The fact that the configuration fuses of the EEPROM are cells modeled as registers that can be programmed to either state (set or cleared, or, referred to in another way, enabled or disabled) is a desirable feature to permit testing all modes of the device. However, at some point the configuration fuses must be made irreversible so that once the configurable options are selected by the OEM they are permanent. To that end, a lockout fuse is used to make the configuration fuses one-time programmable. That capability makes the device susceptible to incorrect programming during final testing at the factory, which can render it unusable when shipped to the customer.

To avoid possible shipment of an unusable device, the present invention provides a scheme by which the device is programmed to place the fuses in a default condition during final test at the factory. A special test mode allows re-writing of fuses for 100% circuit verification. Under factory test conditions, a register acting as a fuse may be written or erased, and its state then verified under programmed tester control.

Figure 5:
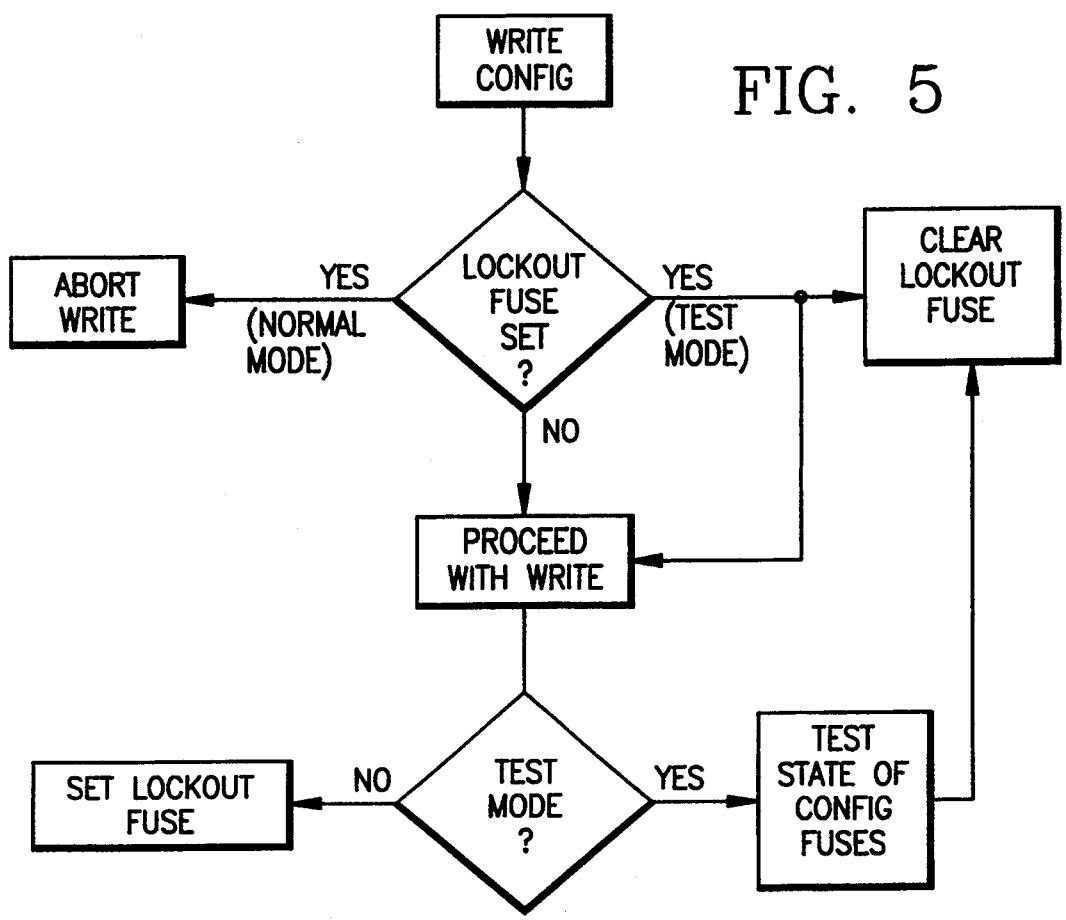
FIG. 5 is a flow diagram of the special test mode used for final testing of the device at the factory.

According to the invention a special test mode is used to clear and override the lockout fuse for factory final test purposes. Referring to FIG. 5, in the normal mode (not the special test mode), when an attempt is made to write the configuration fuses (e.g., registers C and E of FIGS. 2 and 3), the device first checks the state of the lockout fuse. If the lockout fuse is found to be set, it is an indication that the configuration fuses have already been written and cannot be changed. In that event, the write operation is aborted. On the other hand, if the lockout fuse is found to be clear (not set), then the configuration fuses are writable, and the write operation proceeds. When those fuses are being written, the lockout fuse is written at the same time. Hence, at the end of the write to the configuration fuses, the lockout fuse is in the set state and any attempted further write operation on the configuration fuses will be aborted.

In the special test mode of the invention, the configuration fuses are cleared (erased) regardless of the state of the lockout fuse. At the same time, the lockout fuse is cleared to allow subsequent writing. Accordingly, a factory final test sequence may be as follows:

write configuration fuses to configuration A
test fuse state
clear fuses through test mode
write configuration fuses to configuration B
test fuse state
clear fuses through test mode
repeat for configurations C, D, etc., as many times as necessary Since the test mode is the last task to be done, all of the fuses are cleared thereby ensuring that all parts are shipped with the same configuration. Moreover, because the lockout fuse in its cleared state, each of the configuration fuses is, from that point on, rendered one-time programmable. The OEM or other customer may subsequently write the security fuses of the device in the normal mode, which will also write the lockout fuse to prevent any further writes.

Figure 6:
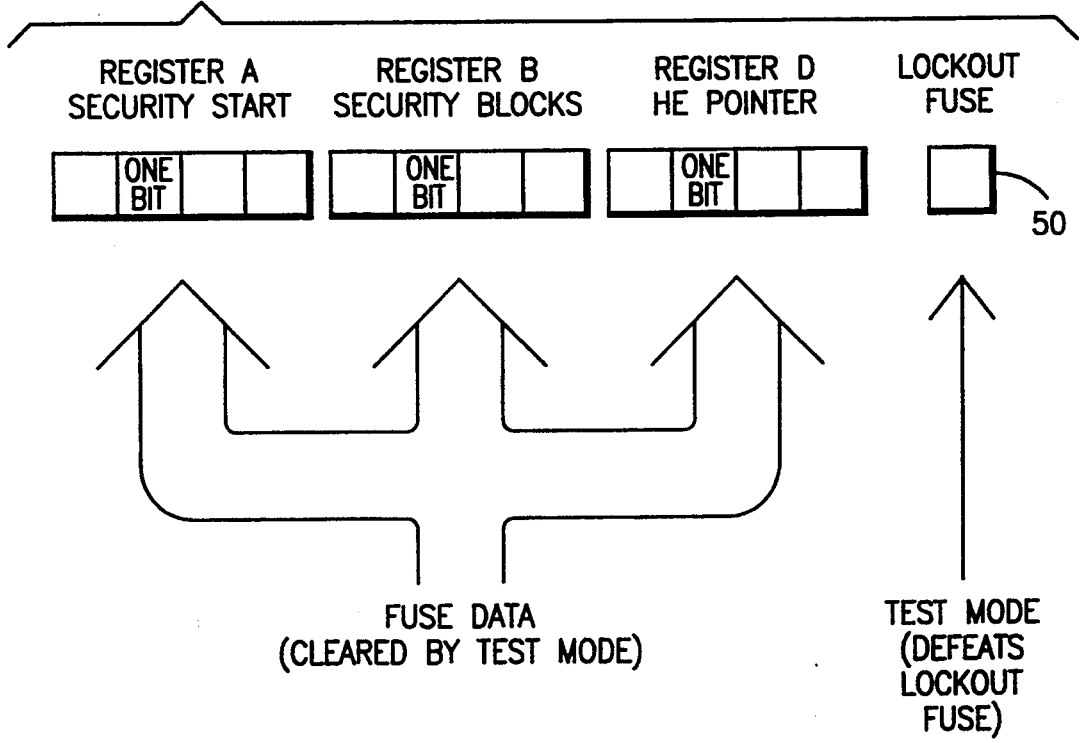
FIG. 6 is simplified block diagram for the special test mode and overriding of the lockout fuse.

Referring to FIG. 6, the configuration fuses for registers A, B and D for security (write protection) block start, security block number, and high endurance block designation, respectively, are all written at the same time in the special test mode. Simultaneously, the lockout fuse 50 is overridden and cleared regardless of its state at the time the test mode was commenced. This override of the lockout fuse is accomplished in the following manner. When the lockout fuse is set, it opens up the programming path to the EEPROM registers, thereby inhibiting further changes to those registers. The special test mode is implemented to provide a parallel path to the registers which is independent of the state of the lockout fuse, and which also goes to the lockout fuse to accomplish clearing of the lockout fuse itself. The parallel path is inaccessible to the user, and the device is designed so that if the user attempts to uncover the special test mode and thereby breach device security, it may result in irreparable damage to the device.

A preferred embodiment and method constituting the best mode presently contemplated for practicing the invention has been described. However, it will be apparent to those skilled in the art that modifications may be made without departing from the true spirit and scope of the invention. For example, configuration options other than or in addition to write protection or endurance may be programmed in the EEPROM device, tested at the factory during final test, the device placed in a default configuration that assures it will be usable by the customer, and available for one-time programming of all configuration options so that any configuration options programmed by the customer are thereafter secured against change. Among other configuration options are density configurations for small chips (die), such as 1K/2K or 2K/4K; organization, such as x8 bit, x16 bit (e.g., 512×8=4K or 256×16=4K); and protocol, such as the use of an extra pin on the package relative to a similar device without such an extra pin.

Accordingly, it is intended that the invention shall be limited only as required by the appended claims and the rules and principles of applicable law.

What is claimed is:

1. Test apparatus for a programmable semiconductor memory device, comprising:

a programmable semiconductor memory device including
a memory array,
selection means providing at least one configurable option for the memory array,
configuration fuse means adapted to be programmed to a first state to prevent alteration of a selected configurable option and to a second state to permit alteration of the selected configurable option, and
lockout fuse means adapted to be programmed to a first state to prevent the configuration fuse means from being programmed from one of said first and second states of the configuration fuse means to the other and to restrict the configuration fuse means to one-time programming thereafter, and said lockout fuse means adapted to be programmed to a second state to permit the configuration fuse means to be programmed repeatedly to one or the other of said first and second states of the configuration fuse means; and
test means for overriding the lockout fuse means to permit testing of the configuration fuse means and to thereafter bring the lockout fuse means and the configuration fuse means to a default condition in which the lockout fuse means assumes its first state to restrict the configuration fuse means to one-time programming thereafter.

2. The invention of claim 1, in which:
the memory array has a multiplicity of contiguous memory blocks, and
the at least one configurable option is one of write protecting or increasing endurance of at least one of the memory blocks.

3. The invention of claim 2, in which:
the memory blocks are of equal capacity, and
the selection means includes security means for write protecting selected ones of the memory blocks to prevent them from being altered once data has been written into them.

4. The invention of claim 2, in which:
the memory blocks are of equal capacity, and
the selection means includes enhancement means for enhancing the endurance of a selected one of the blocks to increase the number of times data may be erased from and written to the selected block relative to the other blocks of the memory array.

5. A test system for a serial EEPROM device, said device including a memory array; programmable option means for selectively configuring at least a portion of the memory array to possess a programmed characteristic selected from the group consisting of write protection, endurance, organization, density and protocol; configuration fuse means having two programmable states including one state for preventing alteration of the characteristic after programming thereof and another state for allowing the characteristic to be reprogrammed; and lockout fuse means having two programmable states including one state for rendering the configuration fuse means programmable only once thereafter and another state for allowing the configuration fuse means to be programmed repeatedly to either of its two states; said test system comprising test means for overriding the lockout fuse means to permit testing of the configuration fuse means and thereafter bring the lockout fuse means and the configuration fuse means to a default condition in which the lockout fuse means assumes its said one state to restrict the configuration fuse means to one-time programming thereafter.

6. The test system of claim 5, in which:
said test means includes means for limiting override of the lockout fuse means to factory final testing of the device.

7. A method of providing programmability of any of a multiplicity of configurable options selected from among write protection, endurance, density, organization and protocol of an EEPROM device so as to permit that programming capability to be verified during factory final testing while securing the device against loss of the programming capability as a result of such testing, and to assure that the device is usable and one-time programmable by the manufacturer's customer after shipment of the device from the factory, including the steps of:
rendering each of the configurable options of the EEPROM device programmable to allow said customer to select a desired available configuration of any of said options,
reversibly fusing the programmability of the configurable options to selectively prevent or allow further programming of the configurable options to enable repeated reprogramming for factory testing purposes,
further fusing the reversible fusing of configurable options programmability to lock out any further programmability of configurable options once set by said customer, and
during factory final test, overriding the further fusing to allow the repeated reprogramming of the device and upon completion of the testing placing the fusing in a default condition in which the reversible fusing is restricted to one-time programmability of configurable options thereafter.

* * * * *